United States Patent
Arai

(10) Patent No.: US 8,363,340 B2
(45) Date of Patent: Jan. 29, 2013

(54) OPTICAL ELEMENT HOLDING APPARATUS, BARREL, EXPOSURE APPARATUS, AND MANUFACTURING METHOD FOR DEVICE

(75) Inventor: Youichi Arai, Honjyo (JP)

(73) Assignee: Nikon Corporation, Tokyo (JP)

( * ) Notice: Subject to any disclaimer, the term of this patent is extended or adjusted under 35 U.S.C. 154(b) by 165 days.

(21) Appl. No.: 12/108,323

(22) Filed: Apr. 23, 2008

(65) Prior Publication Data

US 2008/0259469 A1    Oct. 23, 2008

Related U.S. Application Data

(60) Provisional application No. 60/907,982, filed on Apr. 25, 2007.

(30) Foreign Application Priority Data

Apr. 23, 2007 (JP) .................. 2007-113049

(51) Int. Cl.
*G02B 7/02* (2006.01)
(52) U.S. Cl. ...................................... 359/811
(58) Field of Classification Search .......... 359/811, 359/813, 815, 819, 821, 825–827
See application file for complete search history.

(56) References Cited

U.S. PATENT DOCUMENTS

| 4,733,945 A | 3/1988 | Bacich |
| 5,606,456 A | 2/1997 | Nagata et al. |
| 6,198,579 B1 | 3/2001 | Rupp |
| 6,404,728 B1 * | 6/2002 | Shinozuka et al. ........... 720/681 |
| 6,504,597 B2 | 1/2003 | Schuster et al. |
| 7,154,684 B2 | 12/2006 | Shibazaki |
| 7,751,130 B2 | 7/2010 | Roux et al. |
| 7,768,725 B2 | 8/2010 | Yamano |
| 7,869,147 B2 | 1/2011 | Schwertner et al. |
| 2002/0008858 A1 | 1/2002 | Wagner et al. |
| 2004/0212794 A1 | 10/2004 | Mizuno |
| 2008/0278828 A1 * | 11/2008 | Rau et al. ...................... 359/811 |

FOREIGN PATENT DOCUMENTS

| JP | 62-047011 | 2/1987 |
| JP | 2-287308 | 11/1990 |
| JP | A-HEI-2-287308 | 11/1990 |
| JP | 11-119280 | 4/1999 |
| JP | 2004-340372 | 12/2004 |
| JP | 2006-349946 | 12/2006 |
| JP | 2007-017632 | 1/2007 |

OTHER PUBLICATIONS

Office Action, dated Aug. 10, 2010, issued in corresponding People's Republic of China Patent Application No. 2008800182322.
Second Office Action dated Dec. 6, 2010, issued in corresponding People's Republic of China Patent Application No. 200880018232.2.

(Continued)

*Primary Examiner* — Mohammed Hasan
(74) *Attorney, Agent, or Firm* — Klarquist Sparkman, LLP

(57) ABSTRACT

An optical element holding apparatus includes an annular vibration attenuation plate, which covers a peripheral portion of a lens, and a connection member, which is formed of a damping alloy and which fixes the vibration attenuation plate to a frame body in a state of non-contact with the surface of the lens. The vibration attenuation plate and nitrogen gas in a clearance between the vibration attenuation plate and the surface of the lens form a squeeze film damper.

20 Claims, 7 Drawing Sheets

OTHER PUBLICATIONS

Office Action, with English translation, for related China Patent Application No. 200880018232.2, dated Aug. 31, 2011, 8 pages.
Office Action for related U.S. Appl. No. 13/159,305, dated Jun. 14, 2012, 9 pages.
Office Action for related Japan Patent Application No. 2009-511870 (English translation included), dated Jun. 19, 2012, 6 pages.
Office Action for related Japan Patent Application No. 2009-511870 (English translation included), dated Sep. 11, 2012, 4 pages.

* cited by examiner

OPTICAL ELEMENT HOLDING APPARATUS, BARREL, EXPOSURE APPARATUS, AND MANUFACTURING METHOD FOR DEVICE

CROSS-REFERENCE TO RELATED APPLICATION

This application claims priority to, and the benefit of, Japan Patent Application No. 2007-113049, filed on Apr. 23, 2007, and U.S. Provisional Patent Application No. 60/907,982, filed on Apr. 25, 2007, the contents of both being incorporated herein by reference in their respective entireties.

BACKGROUND

The present invention relates to an optical element holding apparatus for holding an optical element such as a lens and a mirror. The present invention also relates to a barrel including at least one optical element. The present invention further relates to an exposure apparatus used when manufacturing a device such as a semiconductor device, a liquid crystal display device, and a thin-film magnetic head, and to a manufacturing method for a device.

An optical system for this type of exposure apparatus includes optical elements such as a lens and a mirror. In this type of exposure apparatus, each optical element may be distorted when assembling, storing, transporting, or operating the optical system due to temperature changes and external impacts. Such distortion must be minimized or eliminated.

In this regard, the optical systems of the exposure apparatus have a projection optical system that includes optical elements (e.g., a lens) generally accommodated in a barrel by means of a holding apparatus. This holding apparatus includes a lens cell, and the lens cell is designed to prevent vibrations that are produced when assembling the projection optical system (e.g., impact applied to the barrel and transmitted to the lens) and to offset the difference in linear expansion coefficient between the lens and the lens cell caused by temperature changes.

Circuit patterns of semiconductor devices have become further miniaturized due to strict demands for higher integration. Thus, in a semiconductor device manufacturing exposure apparatus, it is required that the exposure accuracy be further improved and that the resolution be further increased. This has increased the significance of technology for holding an optical surface of an optical element in a satisfactory state.

As such a holding apparatus, a holding apparatus including a cantilever bent portion that is formed in the lens cell has been proposed. For example, the holding apparatus has three seating positions, to which a lens is adhered, on the cantilever bent portion (see U.S. Pat. No. 4,733,945). In this conventional structure, the cantilever bent portion absorbs expansion and contraction of the lens cell caused by temperature changes so that mechanical stress does not distort the lens.

SUMMARY

However, in the holding apparatus of the conventional configuration, the cantilever bent portion acts as a spring or a pivot. Thus, the cantilever bent part has a low vibration mode frequency, and vibration of the lens excited by the vibration of a movable member such as a motor or a stage affects the optical performance of the optical system. Further, the cantilever bent portion has a low vibration attenuation rate. Thus, when the lens vibrates, the vibration of the lens may not be attenuated. As a result, the optical performance of the optical system may become unstable and thereby lower the exposure accuracy of the exposure apparatus.

The present invention provides an optical element holding apparatus and a barrel that effectively attenuates vibration of the optical element when the optical element vibrates. The present invention also provides an exposure apparatus and a manufacturing device for a device that efficiently manufactures a device with a high degree of integration.

Embodiments of the present invention employ the structures shown in FIGS. 1 to 9.

One embodiment of the present invention is an optical element holding apparatus (29) for holding an optical element (28). The optical element holding apparatus includes a vibration attenuation member (41) arranged in a state of non-contact with at least part of a surface of the optical element to attenuate vibration of the optical element.

In this embodiment, even if the optical element vibrates, vibration of the optical element is attenuated by the vibration attenuation member arranged in a state of non-contact with the optical element. Furthermore, since the vibration attenuation member is arranged in a state of non-contact with the surface of the optical element, the arrangement of the vibration attenuation member does not change the surface condition of the optical element. Accordingly, the optical performance of the optical element can be maintained in a satisfactory state.

One embodiment of the present invention is an optical element holding apparatus for holding an optical element. The optical element holding apparatus includes a damping mechanism (41, C) for producing a squeeze film effect between the damping mechanism and at least part of a surface of the optical element.

In this embodiment, vibration of the optical element is attenuated with an extremely simple structure using the squeeze film effect produced between the optical element and the damping mechanism, and the optical performance of the optical element is maintained in a satisfactory state.

Reference numerals used in the drawings have been added to facilitate description of the present invention. However, it should be understood that the present invention is not limited to the above embodiments and that the present invention is defined by the scope of the claims.

DETAILED DESCRIPTION OF PREFERRED EMBODIMENTS

An embodiment of the present invention will now be described with reference to the drawings.

First Embodiment

An exposure apparatus, an optical element holding apparatus, and a barrel according to the present invention may be embodied, for example, as an exposure apparatus for manufacturing a semiconductor device, an optical element holding apparatus for holding an optical element such as a lens, and a barrel for accommodating a projection optical system, as shown in FIGS. 1 to 6.

Figure 1:
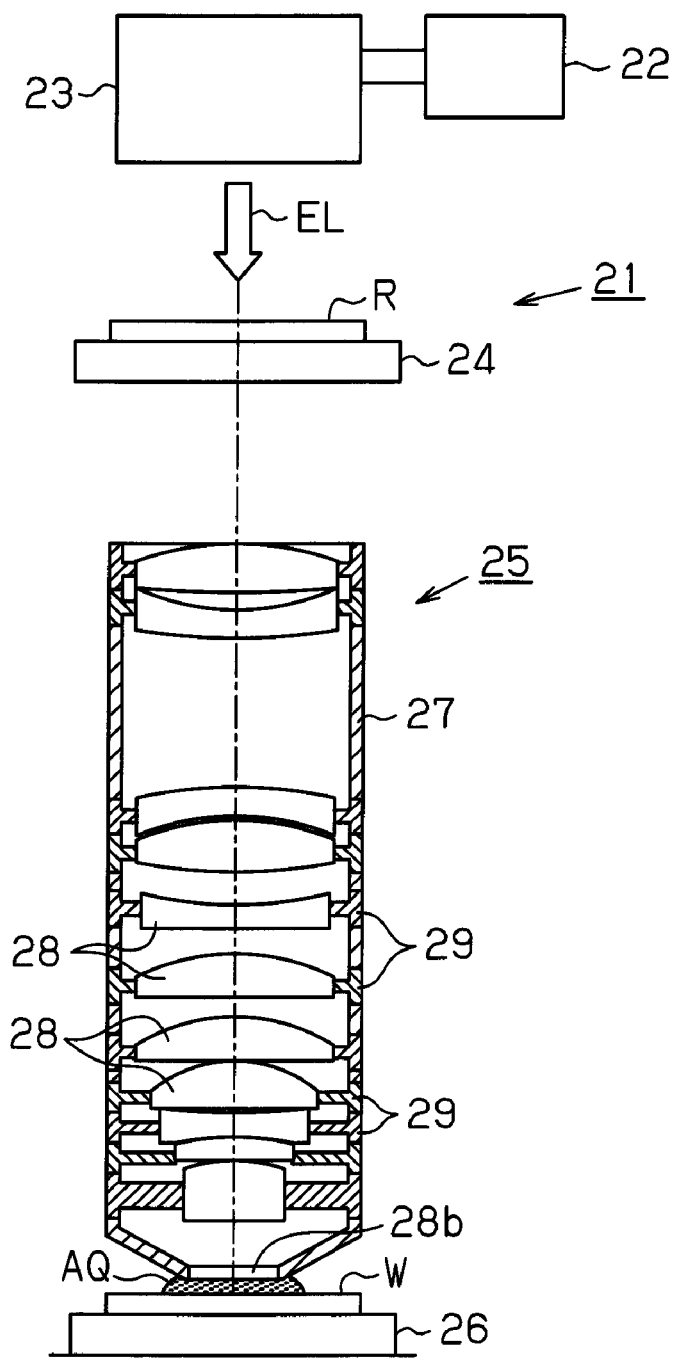
FIG. 1 is a schematic diagram showing an exposure apparatus according to a first embodiment of the present invention.

FIG. 1 is a schematic diagram showing an exposure apparatus 21. As shown in FIG. 1, the exposure apparatus 21 includes a light source 22, an illumination optical system 23, a reticle stage 24 for holding a reticle R (or a photomask), a projection optical system 25, and a wafer stage 26 which holds a wafer W.

The light source 22 includes, for example, an ArF excimer laser light source. The illumination optical system 23 includes various lenses, an aperture diaphragm, and the like (not shown). The various lenses include a relay lens, an optical integrator such as a fly's-eye lens or a rod lens, and a condenser lens. An exposure light EL emitted from the light source 22 is adjusted so as to evenly illuminate a pattern on the reticle R by passing through the illumination optical system 23.

The reticle stage 24 is arranged under the illumination optical system 23, that is, at an object surface side of the projection optical system 25, which will be described later, so that a mounting surface for the reticle R is substantially orthogonal to an optical axis direction of the projection optical system 25. The projection optical system 25 accommodates a plurality of optical elements (e.g., lens 28) in the barrel 27 by means of optical element holding apparatus 29. The wafer stage 26 is arranged at an image plane side of the projection optical system 25 so that the mounting surface for the wafer W intersects the optical axis direction of the projection optical system 25. The projection optical system 25 reduces the image of the pattern on the reticle R illuminated by the exposure light EL by a predetermined reducing magnification and then projects and transfers the image onto the wafer W on the wafer stage 26.

The exposure apparatus of the present embodiment is an immersion exposure apparatus that exposes the wafer W through liquid AQ supplied between an objective lens (e.g., parallel flat plate) 28b (see FIG. 1), which is arranged closest to the wafer W in the barrel 27, and the wafer W. A gas supply mechanism (not shown) is arranged in the barrel 27, and a gas atmosphere is formed in the barrel 27 by inert gas (e.g., nitrogen gas) continuously supplied from the gas supply mechanism.

The structure of an optical element holding apparatus 29 will now be described in detail.

Figure 2:
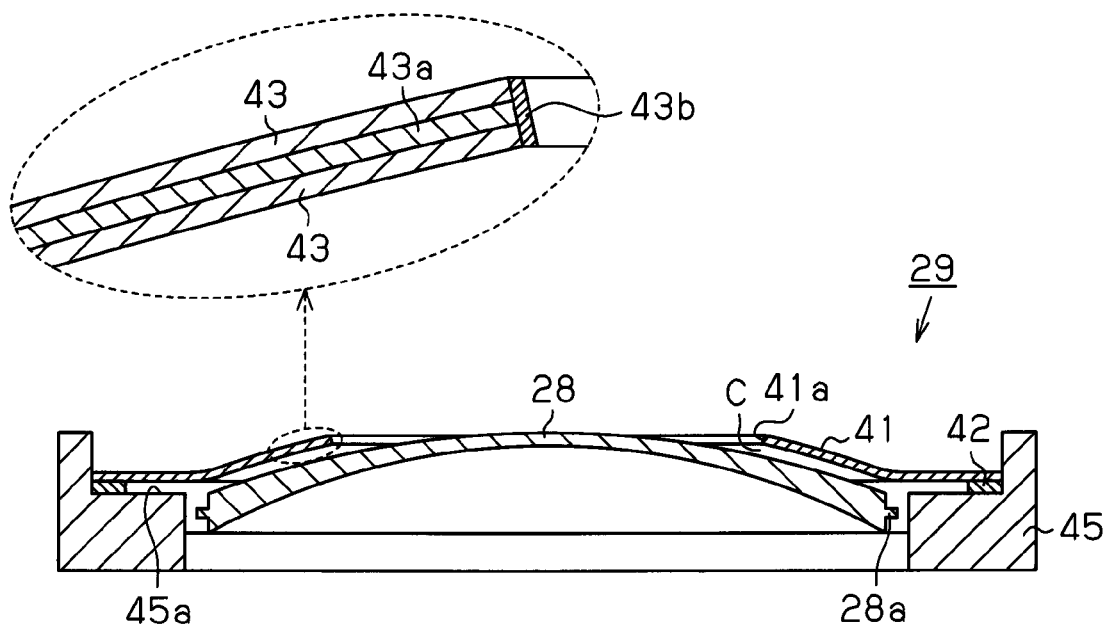
FIG. 2 is a cross-sectional view showing an optical element holding apparatus in the first embodiment of the present invention.

FIG. 2 is a cross-sectional view showing the optical element holding apparatus 29. FIG. 2 shows a cross-section of a portion that does not include a holding member, which will be described later. In the example of FIG. 2, the lens 28 is made of glass material such as synthetic quartz, fluorite, and the like, and has a circular shape (see FIG. 3). A flange 28a is formed on a peripheral portion of the lens 28. The optical element holding apparatus 29 includes an annular frame body 45 formed by machining a metal material. The barrel 27 is formed by stacking a plurality of frame bodies 45. A holder portion 44 (see FIG. 3) for holding the flange 28a of the lens 28 is fixed to the inner circumferential portion of the frame body 45.

Figure 3:
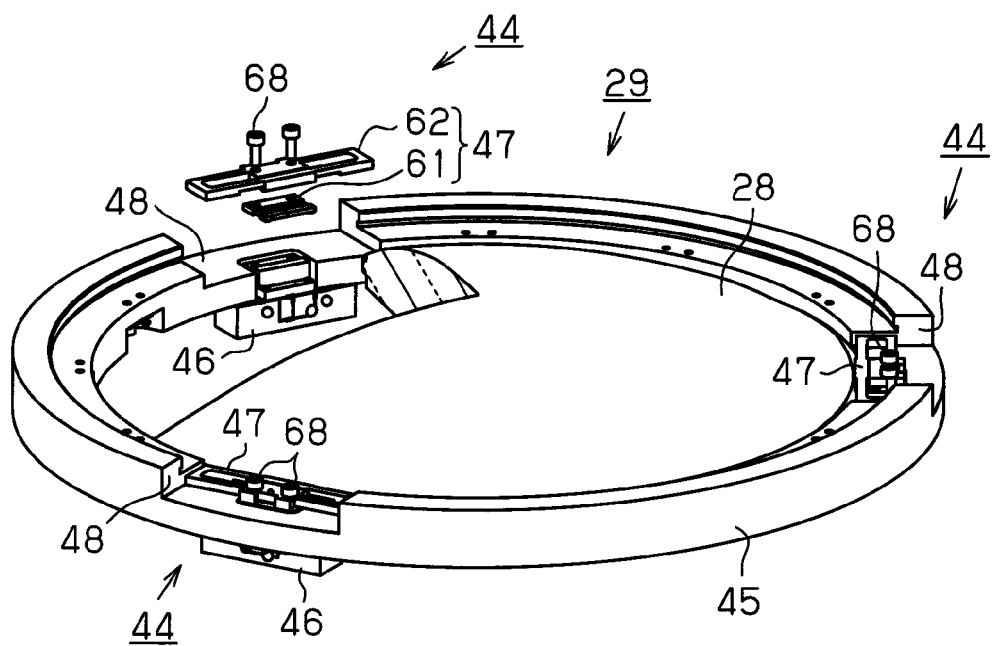
FIG. 3 is a partially cutaway exploded perspective view showing the optical element holding apparatus of FIG. 2.
Figure 4:
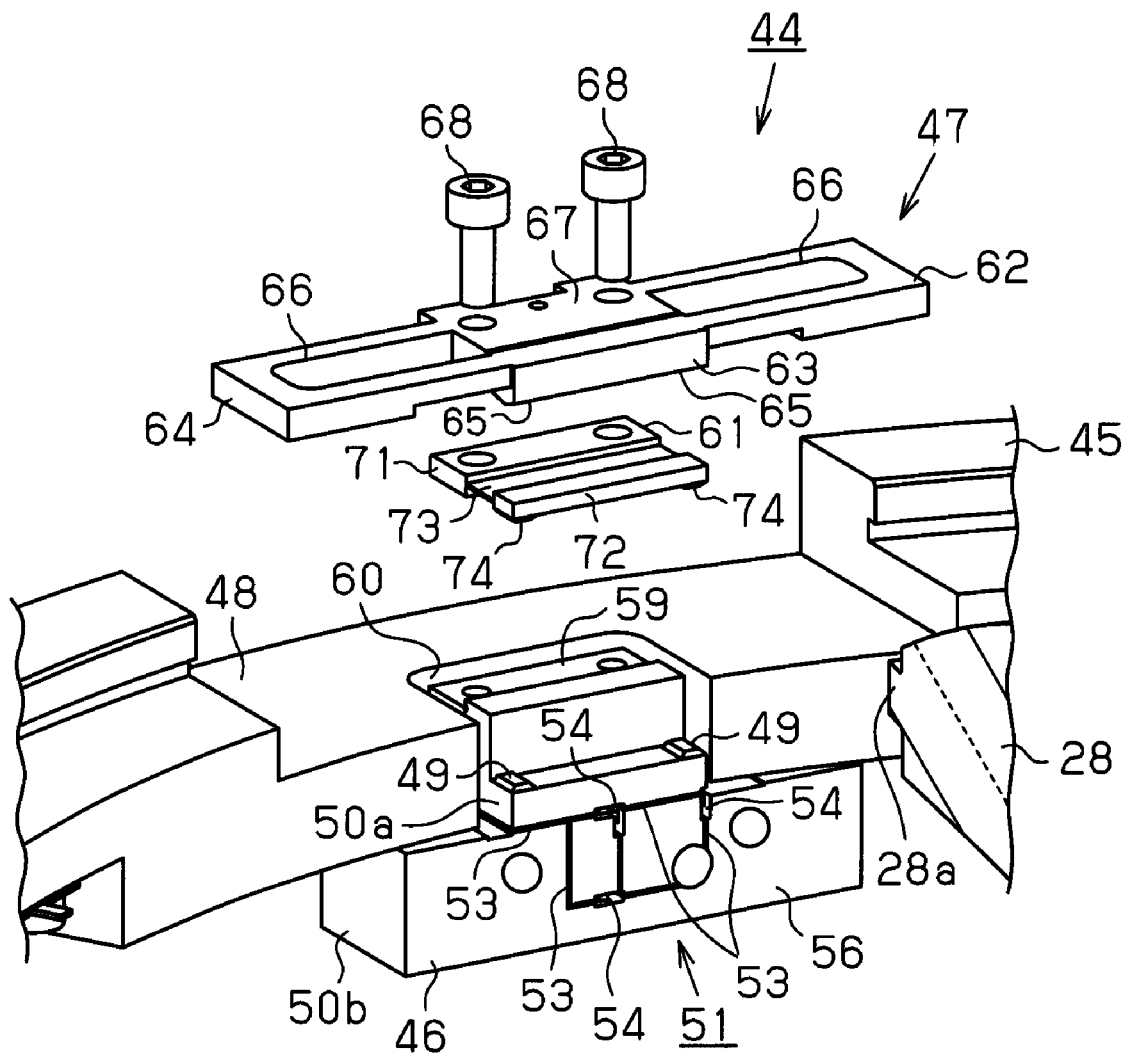
FIG. 4 is an enlarged view showing a holder portion in the optical element holding apparatus of FIG. 3.

FIG. 3 is a perspective view illustrating the holder portion 44, and FIG. 4 is an enlarged view of the holder portion 44. The optical element holding apparatus 29 includes the frame body 45 and three holder portions 44, which are arranged at equal angular intervals on the frame body 45 and which for hold the flange 28a of the lens 28.

As shown in FIG. 4, the holder portion 44 includes a base member 46 and a clamp member 47. Attachment grooves 48 at which the clamp members 47 are attached are formed at equal angular intervals in the upper surface of the frame body 45. An accommodation recess 60 for accommodating a seat block 50a, which will be described later, of the base member 46 is formed in the inner circumferential surface of the attachment groove 48.

The base member 46 is fixed to the frame body 45 on the surface opposite to the attachment groove 48, or on the other surface of the frame body 45. The base member 46 includes the seat block 50a, which has two seats 49 that engage one of the flange surfaces of the flange 28a of the lens 28, and a support block 50b, which is formed with a seat block supporting mechanism 51 for adjustably supporting the orientation of the seat block 50a.

The seat block 50a is arranged so that its longitudinal direction lies along the tangential direction of the lens 28. The seats 49 are formed at the two longitudinal ends of the seat block 50a. Further, the seats 49 project from the surface of the seat block 50a.

Figure 5:
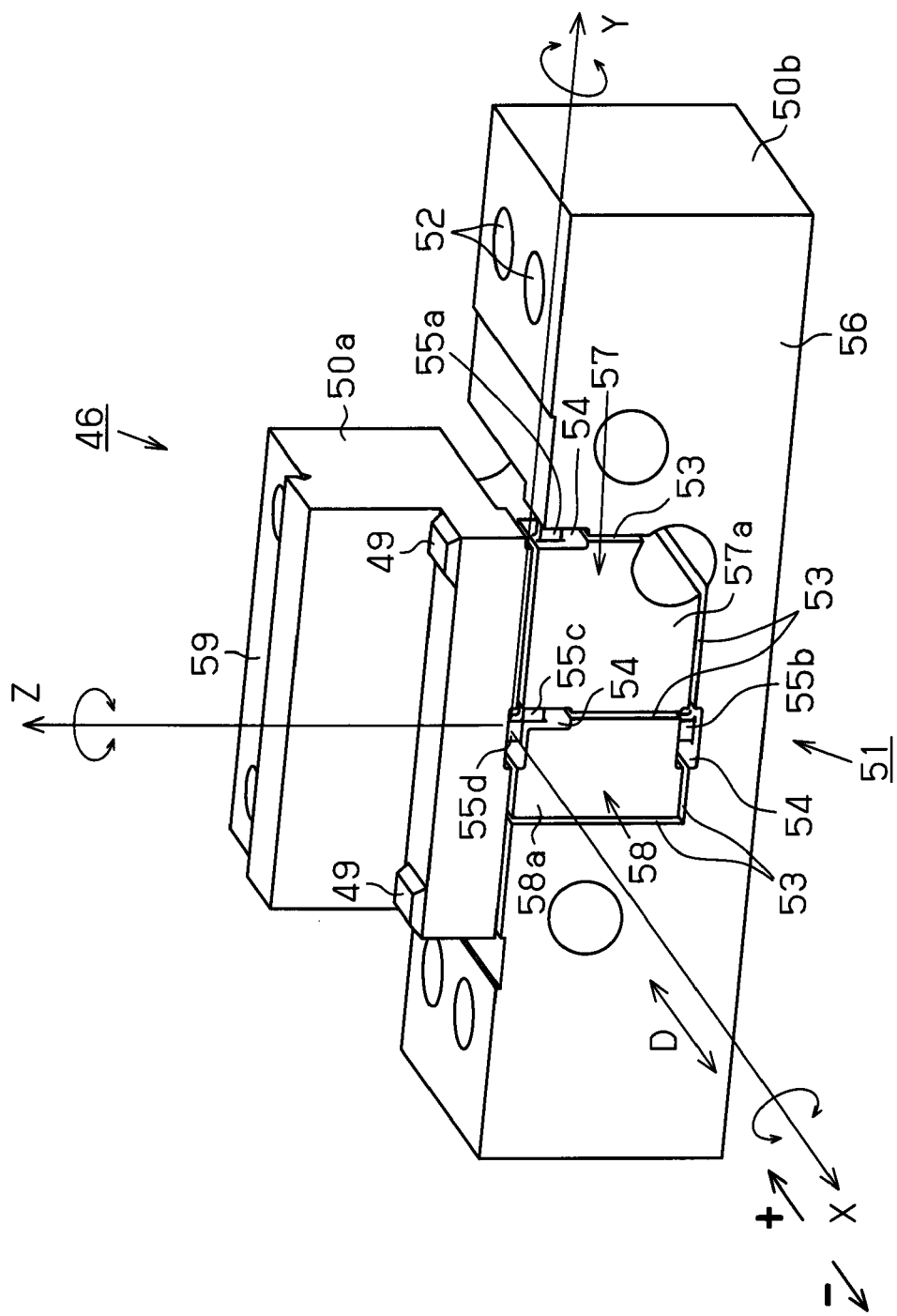
FIG. 5 is an enlarged view showing a seat block and a support block in the optical element holding apparatus of FIG. 3.

FIG. 5 is a perspective view showing the seat block 50a and the support block 50b. As shown in FIG. 5, a plurality of slits 53 extend in the radial direction (X-axis direction of FIG. 4) of the lens 28 between the seat block 50a and the support block 50b and through the support block 50b. A plurality of neck portions 55a to 55d are milled out in the +X direction and −X direction from between the seat block 50a and the support block 50b and in the support block 50b.

The support block 50b is mainly divided into three portions by the plurality of slits 53. That is, the support block 50b is divided into a base 56, which is fixed to the frame body 45, a first block 57a, and a second block 58a.

The first block 57a is fixed to the second block 58a and the base 56 by the first neck portion 55a and the third neck portion 55c. The first block 57a is held rotatably about the Y direction (tangential direction of the lens 28) and restricted from being displaced in the Y direction by the first neck portion 55a and the third neck portion 55c. The first block 57a, the first neck portion 55a, and the third neck portion 55c form a first link 57.

The second block 58a is fixed to the seat block 50a and the base 56 by the second neck portion 55b and the fourth neck portion 55d. The second block 58a is held rotatably about the Z direction (direction parallel to the optical axis of the lens 28) and restricted from being displaced in the Z direction by the second neck portion 55b and the fourth neck portion 55d. The second block 58a, the second neck portion 55b, and the fourth neck portion 55d form a second link 58. The seat block 50a is connected by the fourth neck portion 55d to the support block 50b, specifically, the second block 58a. That is, the seat block 50a is supported by the first link 57 and the second link 58 on the base 56.

In the base member 46 that is formed in this manner, the seat block 50a is supported on the base 56 by the first link 57 and the second link 58 to be rotatable about the X direction, the Y direction, and the Z direction, while it is restricted from being displaced in the Y direction and the Z direction.

As shown in FIG. 4, the clamp member 47 includes a clamp body 62 and a pad member 61. The clamp body 62 includes a pressing block 63 and a supporter 64, which is formed integrally with the pressing block 63 to support the pressing block 63. On the two ends at the lower surface of the pressing block 63, two pressing surfaces 65 are defined facing toward the seats 49 of the seat block 50a.

The supporter 64 includes arm portions 66 and an attachment portion 67. The attachment portion 67 and the pressing block 63 are spaced apart by a predetermined distance. The arms 66 connect the two ends of the pressing block 63 to the attachment portion 67 and are elastically deformable. The clamp member 47 is fixed to the seat block 50a by fastening the attachment portion 67 to a fastening portion 59 of the seat block 50a with bolts 68 by means of the pad member 61.

The pad member 61 includes a clamped portion 71, which is held between the fastening portion 59 and the attachment portion 67, an action portion 72, which is arranged between the pressing surfaces 65 and the flange 28a of the lens 28, and an elastically deformable thin-plate portion 73, which has the form of a thin-plate and connects the clamped portion 71 and the action portion 72.

In the clamp member 47 formed in this manner, the arms 66 are elastically deformed when the bolts 68 are fastened. This applies pressure to the pressing surfaces 65 of the pressing block 63 towards the seat block 50a. The pressure acts on the flange 28a of the lens 28 via an action surfaces 74 on the pad member 61. Thus, the flange 28a of the lens 28 is held by the seats 49 of the seat block 50a and the pressing surfaces 65 of the pressing block 63.

The holder portions 44 formed in this manner are arranged at three locations on the peripheral portion of the lens 28. That is, three link mechanisms formed by the first link 57 and the second link 58 kinematically hold the lens 28. The first link 57 and the second link 58 have a flexure structure formed by the milling described above.

In the present embodiment, the optical element holding apparatus 29 attenuate vibration of optical elements.

Figure 6:
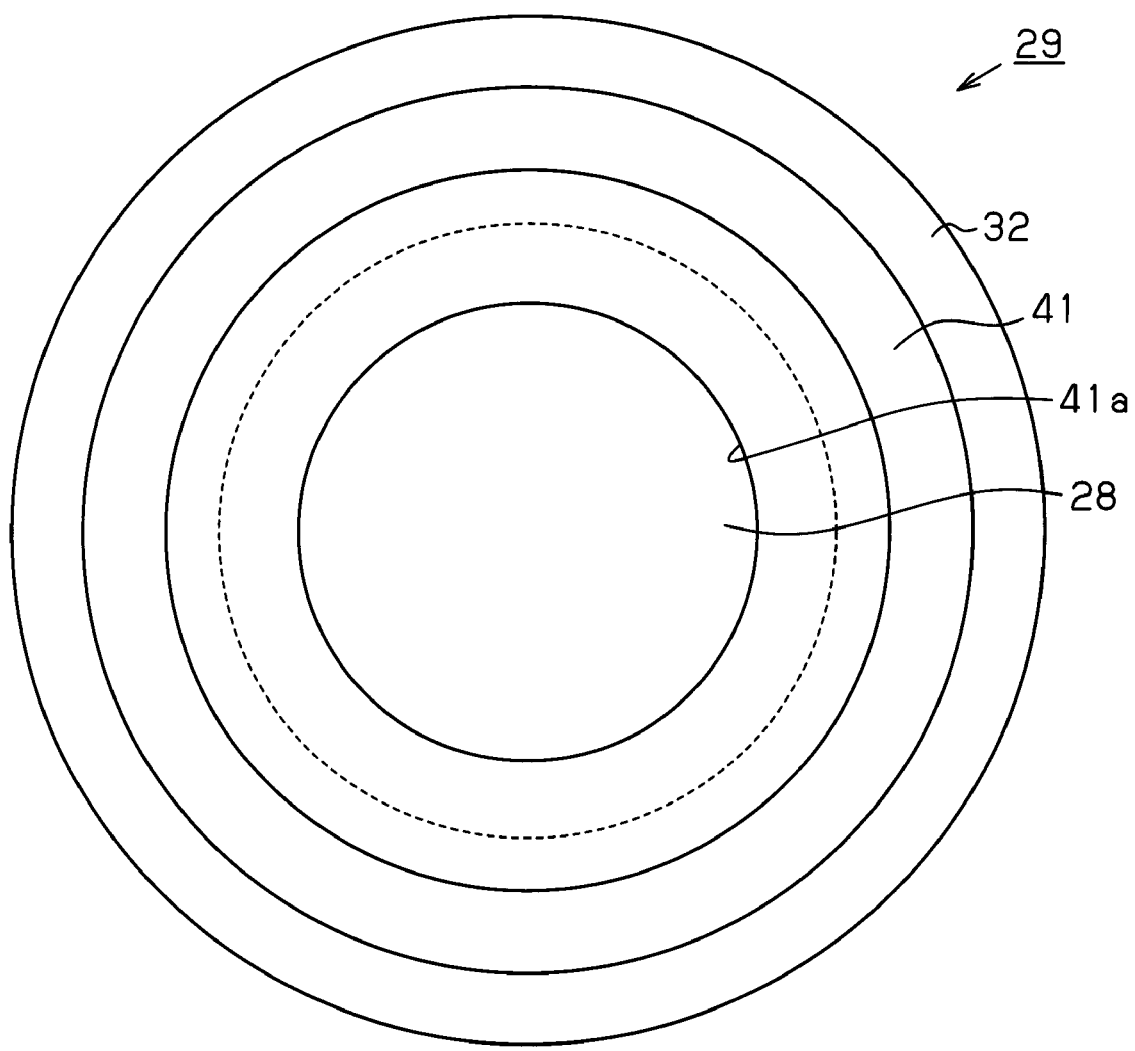
FIG. 6 is a plan view showing the optical element holding apparatus of FIG. 2.

FIG. 6 is a plan view showing of an optical element holding apparatus 29. As shown in FIG. 6, the optical element holding apparatus 29 includes a vibration attenuation member. The vibration attenuation member of the illustrated embodiment includes, for example, an annular vibration attenuation plate 41 that covers the peripheral portion of the lens 28. The vibration attenuation plate 41 is arranged outside a light incident region of the exposure light EL in a state of non-contact with the lens 28, that is, in a state spaced apart from the lens surface by a predetermined distance (controlled distance). The exposure light EL enters the lens 28 through an opening 41a in the vibration attenuation plate 41.

As shown in FIG. 2, the vibration attenuation plate 41 is fixed to the surface 45a of the frame body 45 at the light incident side of the exposure light EL by a connection member 42 formed from a damping alloy. Examples of the damping alloy include, for example, M2052 alloy (Mn; 20% Cu; 5% Ni; 2% Fe), Silentalloy (12% Cr; 3% Al; Fe), Sonoston alloy (Mn; 37% Cu; 4% Al; 3% Fe; 2% Ni), Incramute alloy (Cu; 45% Mn; 2% Al). In FIG. 2, a clearance C between the surface of the lens 28 and the vibration attenuation plate 41 is shown in an enlarged manner and emphasized to facilitate understanding. However, the clearance C is actually very small and has only a few micrometers, such as 2 µm to 20 µm, 2 µm to 10 µm, or 2 µm to 3 µm. The clearance C may be determined in accordance with the area of the vibration attenuation plate 41 facing the surface of the lens 28 or a target vibration frequency.

The vibration attenuation plate 41 is arranged along the surface of the lens 28 and spaced apart from the surface by a controlled distance so as to form the clearance C between the vibration attenuation plate 41 and the lens 28. The clearance C includes nitrogen gas, which is supplied into the projection optical system 25.

As shown in the partially enlarged cross-sectional view of FIG. 2, the vibration attenuation plate 41 includes a damping plate (laminated body) formed by laminating two sheets of thin metal plates 43 with a viscoelastic body 43a arranged between the metal plates 43. The thin metal plates 43 and the viscoelastic body 43a each function as a damping material. The viscoelastic body 43a can be formed from a natural or synthetic rubber, a resin (e.g., high polymer polyethylene resin having viscoelasticity), or a resin gel (e.g., silicon grease, etc.). The metal plates 43 are formed by, for example, plates of steel, stainless steel, or the like. When used in the exposure apparatus 21, it is preferred that the metal plates 43 be washed to prevent the generation of impurities that contaminate the atmosphere in the barrel 27. Furthermore, it is preferred that portions of the viscoelastic body 43a that are exposed in the barrel 27 be covered by a seal material 43b, which generates only a small amount of out-gas, such as a fluorine silicon grease.

The operation of the vibration attenuation plate 41 will now be described.

Vibration of the lens 28 caused by disturbance changes the size of the clearance C between the surface of the lens 28 and the vibration attenuation plate 41. This changes the pressure of the nitrogen gas in the clearance C. Due to the viscosity of the nitrogen gas, the nitrogen gas in the clearance C resists pressure changes in the clearance C and does not flow out of the clearance C. Thus the nitrogen gas in the clearance C between the lens 28 and the vibration attenuation plate 41 functions as a damper and produces a squeeze film effect that attenuates vibration of the lens 28. That is, the arrangement of the vibration attenuation plate 41 in a non-contact state with the surface of the lens 28 enables the nitrogen gas between the lens 28 and the vibration attenuation plate 41 to function as a squeeze film damper.

The vibration attenuation plate 41 itself resists vibrating since the vibration attenuation plate 41 is made of a damping material that attenuates vibration of the vibration attenuation plate 41. Even if the vibration attenuation plate 41 vibrates for one reason or another, such vibration would immediately be attenuated. Furthermore, the vibration attenuation plate 41 is fixed to the frame body 45 by the connection member 42, which is formed from damping alloy. Thus, vibration of the frame body 45 is not transmitted to the vibration attenuation plate 41. Even if vibration of the frame body 45 is transmitted to the vibration attenuation plate 41, such vibration would not affect the optical performance of the lens 28. The vibration attenuation member, the clearance C formed by the vibration attenuation member, and the fluid filling the clearance C form a damping mechanism.

The present embodiment has advantages including those described below:

(1) In the optical element holding apparatus 29, the vibration attenuation plate 41 is arranged in a state of non-contact with part of the surface of the lens 28. Thus, even if the lens 28 vibrates, such vibration is attenuated by pressure changes in the fluid between the vibration attenuation plate 41 and the lens 28. Furthermore, the vibration attenuation plate 41 is spaced apart by a predetermined distance from the surface of the lens 28 without direct contact with the surface condition of the lens 28. Thus, the arrangement of the vibration attenuation plate 41 does not change the surface state of the lens 28. Accordingly, the optical performance of the lens 28 is maintained in a satisfactory state.

(2) In the optical element holding apparatus 29, the vibration attenuation plate 41 is arranged to cover the outer side of the light incident region through which the exposure light EL enters in the surface of the lens 28. Thus, the exposure light EL fully enters the lens 28 without any portion of the exposure light EL being shielded by the vibration attenuation plate 41. This ensures a sufficient amount of light transmitted through the lens 28 and accurately transfers an image of the pattern on the reticle R onto the wafer W.

(3) The vibration attenuation plate 41 is configured by a damping plate including the viscoelastic body 43a. Thus, the vibration attenuation plate 41 itself resists vibrating, and vibration of the vibration attenuation plate 41 would immediately be attenuated. Accordingly, the lens 28 is subtly affected by vibration of the vibration attenuation plate 41. Even if vibration attenuation plate 41 vibrates, such vibration would not affect the optical performance of the lens 28. Accordingly, the vibration attenuation plate 41 functions as a rigid body that forms a squeeze film damper. This further ensures vibration attenuation of the lens 28.

(4) In the optical element holding apparatus 29, the squeeze film effect, which attenuates vibration of the lens 28, is produced by the nitrogen gas between the lens 28 and the vibration attenuation plate 41. When the lens 28 vibrates, pressure changes in the nitrogen gas attenuate the vibration of the lens 28. The nitrogen gas is a fluid that forms the internal atmosphere of the barrel 27 (hereinafter referred to as atmosphere fluid) and enables vibration of the lens 28 to be attenuated with an extremely simple structure while maintains the optical performance of the lens 28 in a satisfactory state.

(5) In the optical element holding apparatus 29, the connection member 42, which has a damping effect, is arranged between the frame body 45 and the vibration attenuation plate 41. This prevents vibration of the vibration attenuation plate 41 from being transmitted to the frame body 45.

(6) In the optical element holding apparatus 29, the lens 28 is held by the three holder portions 44, each including the first link 57 and the second link 58. This kinematically holds the lens 28 in the optical element holding apparatus 29. Thus, deformation of the optical surface of the lens 28 is prevented but the vibration mode frequency may decrease and the lens 28 may be apt to being affected by vibration. However, the squeeze film effect is produced in the clearance between the lens 28 and the vibration attenuation plate 41 by the arrangement of the vibration attenuation plate 41. The squeeze film effect attenuates vibration of the lens 28.

(7) The barrel 27 of the projection optical system 25 is formed by stacking the optical element holding apparatus 29, each including the vibration attenuation plate 41. This attenuates vibration of each lens 28 in the barrel 27, and the optical performance of the projection optical system 25 can be maintained at a high level.

(8) In the exposure apparatus 21, the optical element holding apparatus 29 including the vibration attenuation plate 41 holds the lens 28. Thus, the optical performance of the lens 28 can be maintained at a high level, and the exposure accuracy of the exposure apparatus 21 can be improved.

(9) In the exposure apparatus 21, a lens 28 of the projection optical system 25 for forming a pattern on the wafer W is held by an optical element holding apparatus 29, which includes the vibration attenuation plate 41. With the exposure apparatus 21, in which the optical performance of the projection optical system 25 is one of the factors that greatly affect the exposure accuracy, the optical performance of the projection optical system 25 is improved. This further improves the transfer accuracy of a pattern.

Second Embodiment

An optical element holding apparatus 29 of a second embodiment will now be described with reference to FIG. 7 centering on parts differing from the first embodiment.

Figure 7:
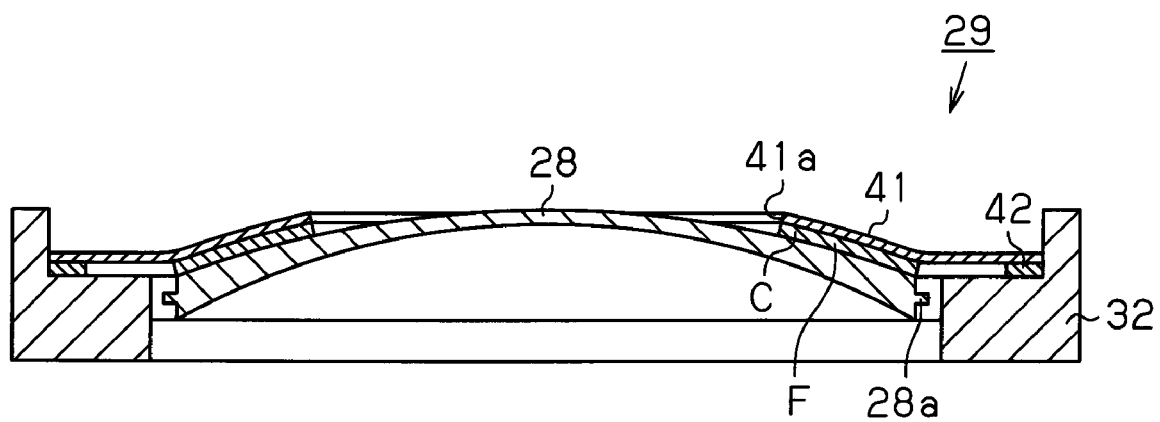
FIG. 7 is a cross-sectional view showing an optical element holding apparatus according to a second embodiment of the present invention.

As shown in FIG. 7, in the optical element holding apparatus 29 of the second embodiment, fluid (e.g., pure water, fluorine silicon grease, or the like) F having a higher viscosity than atmosphere fluid (nitrogen gas in the illustrated example) is charged into the clearance C between the surface of the lens 28 and the vibration attenuation plate 41.

In addition to advantages (1) to (9), the present embodiment has the advantage described below.

(10) In the optical element holding apparatus 29, the fluid F, which has a higher viscosity than nitrogen gas, is charged into the clearance C between the surface of the lens 28 and the vibration attenuation plate 41. As a result, the viscosity of the fluid F in the clearance C further effectively obtains the squeeze film effect. Thus, the vibration attenuation effect of the lens 28 is further improved.

The above embodiments may be modified to other embodiments as described below.

In each embodiment, the vibration attenuation plate 41 is formed by a laminated body of metal plates and a viscoelastic body. However, the vibration attenuation plate 41 may be formed from a single metal plate. In this case, the single metal plate merely needs to have a thickness (rigidity) necessary for the fluid in the clearance C, which is formed with the lens 28, to attenuate the vibration of the lens 28. The damping alloy forming the connection member 42 may be employed in the vibration attenuation plate 41.

In each embodiment, the vibration attenuation plate 41 is arranged in state of non-contact with the light incident surface side of the lens 28. However, the vibration attenuation plate 41 may be arranged in a state of non-contact at a light exiting surface side of the lens 28 or at a side surface of the lens 28 and the flange 28a formed on a peripheral portion of the lens 28.

The optical element holding apparatus 29 in each embodiment holds the lens 28 kinematically, or with six degrees of freedom. However, the optical element holding apparatus does not have to hold the lens 28 kinematically, with six degrees of freedom. For example, the holding apparatus may hold the lens 28 with three degrees of freedom or five degrees of freedom.

The holder portions 44 in each embodiment are arranged at equal intervals on the frame body 45 but may be arranged at unequal intervals.

In each embodiment, the metal plate 43 of the vibration attenuation plate 41 is formed from steel. However, the metal plate 43 may be formed from light metal such as aluminum that has undergone a washing treatment or a coating treatment to prevent the generation of impurities.

In each embodiment, the vibration attenuation plate 41 is fixed to the frame body 45 but may be fixed to the holder portion 44 instead.

In each embodiment, the vibration attenuation plate 41 is arranged to entirely cover the peripheral portion of the surface of the lens 28. However, the vibration attenuation plate 41 may include cutout portions such that the lens 28 is only partially covered in the circumferential direction. In such a case, the use of the vibration attenuation plate 41 keeps the weight low.

In each embodiment, the vibration attenuation plate 41 is arranged only on one side of the lens 28 but may be arranged on both sides of the lens 28. In such a case, the vibration attenuation effect of the lens 28 is further increased.

In each embodiment, the vibration attenuation plate 41 may also function as an aperture diaphragm.

In each embodiment, the vibration attenuation plate 41 is annular. However, the opening 41a of the vibration attenuation plate 41 may be shaped in correspondence with the light incident region of the exposure light EL in the lens 28 and be, for example, quadrangle.

In each embodiment, the vibration attenuation plate 41 is fixed to the frame body 45 by the connection member 42 but may be directly fixed to the frame body 45.

In each embodiment, the atmosphere fluid in the barrel 27 is nitrogen gas. However, the atmosphere fluid may be air or inert gas such as helium, argon, krypton, radon, neon, xenon, and the like.

In each embodiment, the optical element holding apparatus of the present invention is embodied in the optical element holding apparatus 29 for holding the lens 28. The optical element holding apparatus of the present invention may also be embodied in an optical element holding apparatus for holding other optical elements, such as a mirror, half mirror, parallel flat plate, prism, prism mirror, rod lens, fly's-eye lens, phase difference plate, throttle plate, or the like.

The optical element holding apparatus is not limited to a holding structure for a lens 28 that is horizontally arranged in the projection optical system 25 of the exposure apparatus 21 as in the above embodiments. For example, the optical element holding apparatus may be embodied in a holding structure for an optical element that is vertically arranged in the illumination optical system 23 of the exposure apparatus 21. Furthermore, the optical element holding apparatus may be embodied in a holding structure for an optical element of in an optical system of other optical machines, such as a microscope, an interferometer, or the like.

Water (pure water), fluorine-containing liquid, and decaling (decahydronaphthalene; $C_{10}H_{18}$) may be used as the liquid AQ in the immersion exposure apparatus of the present embodiment.

Application of the optical element holding apparatus is not limited to an immersion exposure apparatus. The optical element holding apparatus is also applicable to an exposure apparatus having a predetermined gas (e.g., air or inert gas) filled between a projection optical system and a wafer. The optical element holding apparatus is also applicable to an optical system, such as an optical system for a contact exposure apparatus, which arranges a mask and a substrate in close contact with each other when exposing a pattern of the mask without using a projection optical system, and a proximity exposure apparatus, which arranges a mask and a substrate proximal to each other when exposing a pattern of the mask. The projection optical system is not limited to an all-refraction type and may a reflection-refraction type or all-reflection type system.

Furthermore, the exposure apparatus of the present invention is not limited to an exposure apparatus of a reduction exposure type and may be an equal magnification exposure type or enlargement exposure type exposure apparatus.

The present invention is applicable not only to an exposure apparatus that manufactures a micro-device such as a semiconductor device but also to an exposure apparatus for transferring a circuit pattern from a mother reticle to a glass substrate, a silicon wafer, or the like to manufacture a reticle or a mask used in a light exposure apparatus, an EUV exposure apparatus, an X-ray exposure apparatus, an electron beam exposure apparatus, or the like. A transmissive reticle is generally used in an exposure apparatus using DUV (Deep Ultra Violet), VUV (Vacuum Ultra Violet) light, or the like. Quartz glass, quartz glass doped with fluorine, fluorite, magnesium fluoride, crystal, or the like may be used as the reticle substrate. In a proximity type X-ray exposure apparatus, an electron beam exposure apparatus, or the like, a transmissive mask (stencil mask, membrane mask) is used and silicon wafer or the like is used as the mask substrate.

Obviously, the present invention is also applicable not only to an exposure apparatus for manufacturing a semiconductor device but also to an exposure apparatus for manufacturing a display including a liquid crystal display device (LCD) or the like and transfers a device pattern onto a glass plate, an exposure apparatus for manufacturing a thin-film magnetic head or the like and transfers a device pattern onto a ceramic wafer or the like, and an exposure apparatus for manufacturing an imaging element such as a CCD or the like.

Furthermore, the present invention may be applied to a scanning stepper that transfers a pattern of a mask onto a substrate in a state in which the mask and the substrate are relatively moved and sequentially step-moves the substrate, and a step-and-repeat type stepper that transfers a pattern of a mask onto a substrate in a state in which the mask and the substrate are still and sequentially step-moves the substrate.

The light source of the exposure apparatus may be a g-line (436 nm), an i-line (365 nm), a KrF excimer laser (248 nm), an $F_2$ laser (157 μm), a $Kr_2$ laser (146 nm), an $Ar_2$ laser (126 nm), or the like. The harmonic wave in which single wavelength laser light of infrared region or visible region oscillated from the DFB semiconductor laser or the fiber laser is amplified with a fiber amplifier doped with erbium (or both erbium and ytterbium), and wavelength converted to an ultraviolet light using a non-linear optical crystal may be used.

The exposure apparatus 21 of each embodiment is manufactured, for example, in the following manner:

First, at least some of the optical elements, such as the plurality of lenses 28 or mirrors, forming the illumination optical system 23 and the projection optical system 25 are held by the optical element holding apparatus 29 of the present embodiment. The illumination optical system 23 and the projection optical system 25 are arranged in the main body of the exposure apparatus 21 and then optical adjustments are performed. The wafer stage 26 (including the reticle stage 24 for a scan type exposure apparatus), which is formed by many mechanical components, is attached to the main body of the exposure apparatus 21. Then, wires are connected. After connecting a gas supply pipe for supplying gas into the optical path of the exposure light EL, general adjustments (electrical adjustment, operation check, or the like) are performed.

Each component is assembled to the optical element holding apparatus 29 after removing processing oil and impurities such as metal material by performing ultrasonic cleaning or the like. The manufacturing of the exposure apparatus 21 is preferably performed in a clean room in which the temperature, humidity, and pressure are controlled, and in which the cleanness is adjusted.

In each embodiment, fluorite, synthetic quartz, or the like can be used as the glass material. However, the optical element holding apparatus of the above embodiments may also be applied when crystals such as lithium fluoride, magnesium fluoride, strontium fluoride, lithium-calcium-aluminum-fluoride, lithium-strontium-aluminum-fluoride, or the like; glass fluoride including zirconium-barium-lanthanum-aluminum; and modified quartz such as quartz glass doped with fluorine, quartz glass doped with hydrogen in addition to fluorine, quartz glass containing a OH group, quartz glass containing a OH group in addition to fluorine can be used.

An embodiment of a manufacturing method for a device in which the exposure apparatus 21 described above is used in a lithography process will now be described.

Figure 8:
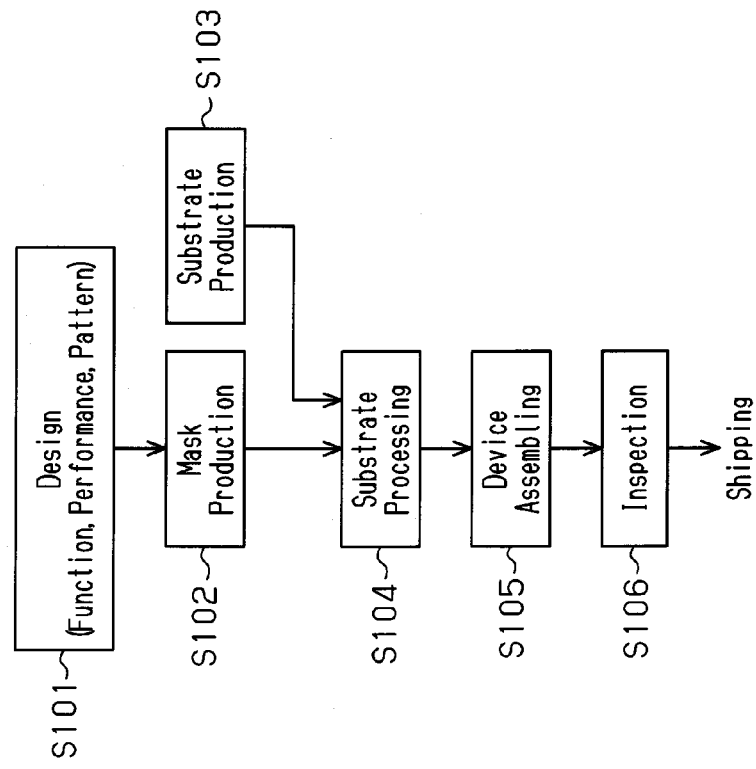
FIG. 8 is a flowchart of an example for manufacturing a device.

FIG. 8 is a flowchart illustrating an example for manufacturing a device (semiconductor device such as an IC and LSI, liquid crystal display device, imaging device (CCD or the like), thin-film magnetic head, micro-machine, or the like). As shown in FIG. 8, first in step S101 (design step), a function/performance design (e.g., circuit design etc. of semiconductor device) of the device (micro-device) is performed, and a pattern design for realizing the function of the device is performed. Subsequently, in step S102 (mask production step), a mask (reticle R etc.) that forms the designed circuit pattern is produced. In step S103 (substrate production step), a substrate (wafer W when silicon material is used) is produced using material such as silicon, glass plate, or the like.

In step S104 (substrate processing step), the mask and substrate prepared in steps S101 to S103 are used to form an actual circuit or the like on the substrate through a lithography technique, as will be described later. In step S105 (device assembling step), device assembly is performed using the substrate processed in step S104. Step S105 includes the necessary processes, such as dicing, bonding, and packaging (chip insertion or the like).

Finally, in step S106 (inspection step), inspections such as an operation check test, durability test, or the like are conducted on the device manufactured in step S105. Upon completion of such processes, the device is completed and the shipped out of the factory.

Figure 9:
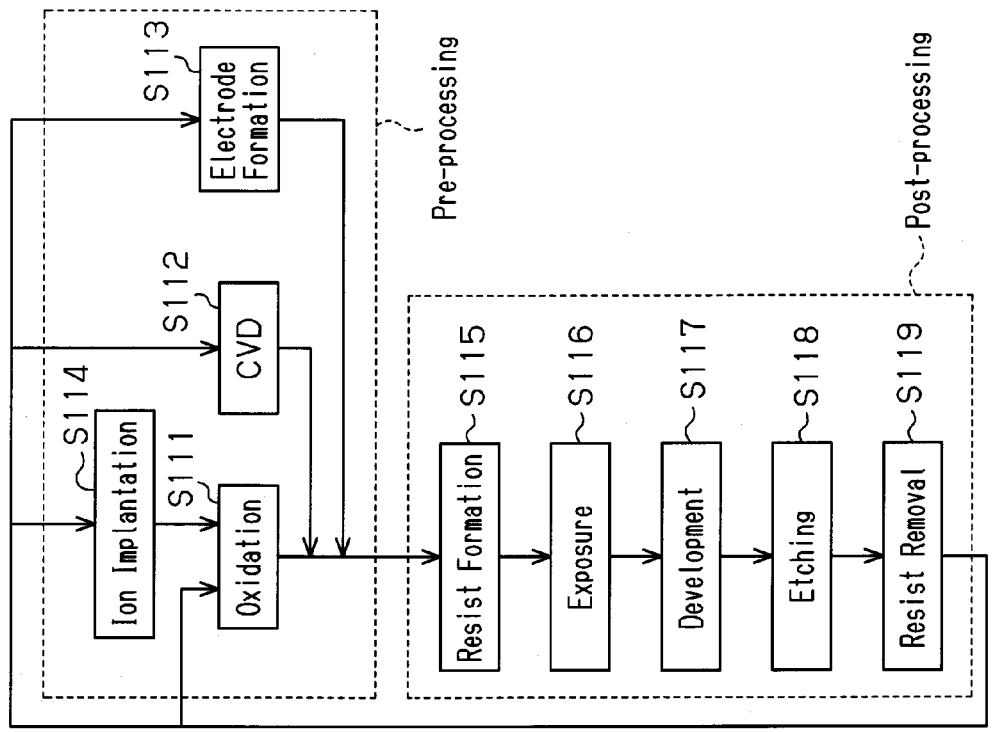
FIG. 9 is a detailed flowchart related to substrate process for a semiconductor device.

FIG. 9 is a flowchart showing in detail one example of the procedures performed in step S104 of FIG. 8 in the case of a semiconductor device. As shown in FIG. 9, in step S111 (oxidation step), the surface of the wafer W is oxidized. In step S112 (CVD step), an insulating film is formed on the surface of the wafer W. In step S113 (electrode formation step), an electrode is formed on the wafer W by performing vapor deposition. In step S114 (ion implantation step), ions are implanted into the wafer W. Steps S111 to S114 described above are pre-processing operations for each stage of wafer processing and are selected and performed in accordance with the processing necessary in each stage.

In each wafer processing stage, when the above-described pre-processing ends, post-processing is performed as described below. In the post-processing, first in step S115 (resist formation step), a photosensitive agent is applied to the wafer W. Subsequently, in step S116 (exposure step), the circuit pattern of a mask (reticle R) is transferred onto the wafer W by the lithography system (exposure apparatus 21), which is described above. In step S117 (development step), the exposed wafer W is developed, and in step S118 (etching step), exposed parts where there is no remaining resist are etched and removed. In step S119 (resist removal step), unnecessary resist subsequent to etching is removed.

Repetition of the pre-processing and post-processing forms many circuit patterns on the wafer W.

In the above-described device manufacturing method of the present embodiment, the use of the exposure apparatus 21 in the exposure process (step S116) enables the resolution to be increased due to the exposure light EL of the vacuum ultraviolet band. Further, the exposure light amount can be controlled with high accuracy. As a result, devices with a high degree of integration and having a minimum line width of about 0.1 μm are manufactured at a satisfactory yield.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An optical element holding apparatus that holds an optical element, the optical element holding apparatus comprising a vibration attenuation plate arranged in a state of non-contact with at least part of a surface of the optical element to attenuate vibration of the optical element, wherein vibration of the optical element is attenuated by a fluid between the optical element and the vibration attenuation plate.

2. The optical element holding apparatus according to claim 1, wherein the vibration attenuation plate is arranged to cover at least part of a region other than a light incident region in the surface of the optical element.

3. The optical element holding apparatus according to claim 2, wherein the vibration attenuation plate is arranged in a state of non-contact with an upstream- or downstream-facing surface of the optical element.

4. The optical element holding apparatus according to claim 1, wherein the vibration attenuation plate is extended over and spaced by a predetermined distance from the at least part of a surface of the optical element.

5. The optical element holding apparatus according to claim 1, wherein the vibration attenuation plate includes a damping material that attenuates vibration of the vibration attenuation plate.

6. The optical element holding apparatus according to claim 5, wherein the damping material includes either one of a metal plate or a laminated body, the laminated body including at least one metal sheet and a viscoelastic body.

7. The optical element holding apparatus according to claim 1, wherein the fluid has a higher viscosity than a fluid that forms an atmosphere to which the optical element is exposed.

8. The optical element holding apparatus according to claim 1, further comprising a squeeze film damper situated between the optical element and the vibration attenuation plate.

9. The optical element holding apparatus according to claim 1, wherein the vibration attenuation plate is attached to at least one holding member that holds the optical element.

10. The optical element holding apparatus according to claim 9, wherein a connection member having a damping effect is arranged between the holding member and the vibration attenuation plate.

11. An optical element holding apparatus that holds an optical element, the optical element holding apparatus comprising a damping mechanism including a vibration attenuation member that faces at least a part of a surface of the optical element and produces a squeeze film effect between the vibration attenuation member and the at least part of a surface of the optical element, wherein the damping mechanism produces pressure changes in a fluid in a clearance between the vibration attenuation member and the surface of the optical element when the optical element vibrates.

12. The optical element holding apparatus according to claim 11, wherein the damping mechanism attenuates vibration of the optical element by the pressure changes in the fluid.

13. A barrel for holding a plurality of optical elements, the barrel comprising the optical element holding apparatus according to claim 1 for holding at least one of the optical elements.

14. An exposure apparatus for exposing a substrate with an exposure light through a plurality of optical elements, the exposure apparatus comprising the optical element holding apparatus according to claim 1 for holding at least one of the optical elements.

15. The exposure apparatus according to claim 14, wherein the plurality of optical elements configure an optical system for forming a pattern on the substrate.

16. A method for manufacturing a device, the method comprising a lithography process, wherein the lithography process uses the exposure apparatus according to claim 14.

17. A barrel for holding a plurality of optical elements, the barrel comprising the optical element holding apparatus according to claim 11 for holding at least one of the optical elements.

18. An exposure apparatus for exposing a substrate with an exposure light through a plurality of optical elements, the exposure apparatus comprising the optical element holding apparatus according to claim 11 for holding at least one of the optical elements.

19. The exposure apparatus according to claim 17, wherein the plurality of optical elements configure an optical system for forming a pattern on the substrate.

20. A method for manufacturing a device, the method comprising a lithography process, wherein the lithography process uses the exposure apparatus according to claim 17.

* * * * *